(12) United States Patent
Feng

(10) Patent No.: US 12,495,713 B2
(45) Date of Patent: Dec. 9, 2025

(54) LIGHT-EMITTING ELEMENT AND METHOD FOR MANUFACTURING THE SAME

(71) Applicants: Beijing BOE Technology Development Co., Ltd., Beijing (CN); BOE Technology Group Co., Ltd., Beijing (CN)

(72) Inventor: Jingwen Feng, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 17/777,411

(22) PCT Filed: Apr. 25, 2021

(86) PCT No.: PCT/CN2021/089593
§ 371 (c)(1),
(2) Date: May 17, 2022

(87) PCT Pub. No.: WO2022/226683
PCT Pub. Date: Mar. 11, 2022

(65) Prior Publication Data
US 2024/0188394 A1    Jun. 6, 2024

(51) Int. Cl.
*H10K 85/00* (2023.01)
*H10K 59/80* (2023.01)
*G02B 5/00* (2006.01)

(52) U.S. Cl.
CPC ............ *H10K 85/00* (2023.02); *H10K 59/875* (2023.02); *G02B 5/008* (2013.01)

(58) Field of Classification Search
CPC .......... H10K 59/875; H10K 2102/331; H10K 59/35; H10K 85/00; G02B 5/008; B82Y 20/00
See application file for complete search history.

(56) References Cited

U.S. PATENT DOCUMENTS

| 2007/0114523 A1* | 5/2007 | Oumi | .................. C03C 17/3628 257/40 |
| 2018/0342706 A1* | 11/2018 | Zhang | .................. H10K 50/816 |

(Continued)

FOREIGN PATENT DOCUMENTS

| CN | 103872261 A | * | 6/2014 | ......... H01L 51/5268 |
| CN | 107230747 A | | 10/2017 | |

(Continued)

OTHER PUBLICATIONS

PCT/CN2021/089593 international search report and written opinion.

*Primary Examiner* — Syed I Gheyas
(74) *Attorney, Agent, or Firm* — IPro, PLLC

(57) ABSTRACT

A light-emitting element and a method for manufacturing the light-emitting element are provided in the present disclosure. The light-emitting element includes: an anode layer and a cathode layer arranged opposite to each other, a light-emitting layer disposed between the anode layer and the cathode layer, a hole transport layer disposed between the light-emitting layer and the anode layer, an electron transport layer disposed between the light-emitting layer and the cathode layer, and at least one metal nanofilm layer including metal nanostructures, the metal nanofilm layer being arranged between the anode layer and the cathode layer and spaced apart from the light-emitting layer at at least one film layer.

16 Claims, 4 Drawing Sheets

(56) References Cited

U.S. PATENT DOCUMENTS

2021/0328191 A1\* 10/2021 Huang .................. H10K 50/85
2022/0059801 A1  2/2022 Zhang

FOREIGN PATENT DOCUMENTS

| CN | 108832014 A |   | 11/2018 | |
|----|-------------|---|---------|---|
| CN | 107046101 B | * | 2/2019  | ............ B82Y 30/00 |
| CN | 111785840 A |   | 10/2020 | |
| CN | 111816792 A |   | 10/2020 | |

\* cited by examiner

LIGHT-EMITTING ELEMENT AND METHOD FOR MANUFACTURING THE SAME

CROSS-REFERENCE TO RELATED APPLICATION

This application is the U.S. national phase of PCT Application No. PCT/CN2021/089593 filed on Apr. 25, 2021, which is incorporated by reference herein in its entirety.

TECHNICAL FIELD

The present disclosure relates to the field of display technology, and in particular to a light-emitting element and a method for manufacturing the light-emitting element.

BACKGROUND

Along with the development of a quantum dot material, the continuous optimization of an element structure as well as the continuous and in-depth research on effective charge transport, a Quantum Dot Light-Emitting Diode (QLED) display is expected to become a mainstream in a next-generation display technology by replacing a quantum dot brightness-enhancement film and a quantum dot color filter in photoluminescence technology. In the related art, such issues as unbalanced carrier injection and low light utilization efficiency occur in a light-emitting element such as QLED element, Organic Light-Emitting Diode (OLED) element.

SUMMARY

A light-emitting element and a method for manufacturing the light-emitting element are provided in the embodiments of the present disclosure, so as to simultaneously optimize electrical and optical properties of the light-emitting element, thereby to improve an efficiency and a service life of the element.

The technical solutions in the embodiments of the present disclosure are as follows.

A light-emitting element is provided, including: an anode layer and a cathode layer arranged opposite to each other, a light-emitting layer disposed between the anode layer and the cathode layer, a hole transport layer disposed between the light-emitting layer and the anode layer, an electron transport layer disposed between the light-emitting layer and the cathode layer, and at least one metal nanofilm layer including metal nanostructures, the metal nanofilm layer being arranged between the anode layer and the cathode layer and spaced apart from the light-emitting layer at at least one film layer.

Illustratively, the metal nanofilm layer is disposed between the electron transport layer and the cathode layer, and/or, the metal nanofilm layer is disposed between the hole transport layer and the anode layer.

Illustratively, each metal nanostructure is a metal nanoparticle, and the metal nanoparticle is made of at least one of gold, silver, copper, aluminium, platinum or palladium.

Illustratively, particle sizes of the metal nanoparticles range from 2 nm to 160 nm.

Illustratively, a thickness of the metal nanofilm layer ranges from 1 nm to 50 nm.

Illustratively, the metal nanofilm layer includes a silver thin film having metal nano-island structures, a thickness of the silver thin film is less than or equal to 10 nm, and the metal nanostructures are the metal nano-island structures.

Illustratively, the light-emitting element further includes a plurality of pixel units arranged in an array form, each pixel unit includes at least two sub-pixels capable of emitting light in different colors, the metal nanostructures of the metal nanofilm layer have different particle sizes in different sub-pixels, and the longer a wavelength of light emitted by a sub-pixel is, the larger particle sizes of the metal nanostructures corresponding to the sub-pixel are.

Illustratively, the at least two sub-pixels include at least two of a red sub-pixel, a green sub-pixel and a blue sub-pixel, the metal nanofilm layer includes gold nanoparticles in the red sub-pixel, and particle sizes of the gold nanoparticles in the red sub-pixel range from 80 nm to 150 nm. The metal nanofilm layer includes gold nanoparticles in the green sub-pixel, and particle sizes of the gold nanoparticles in the green sub-pixel range from 20 nm to 50 nm. The metal nanofilm layer includes aluminium nanoparticles in the blue sub-pixel, and particle sizes of the aluminium nanoparticles in the blue sub-pixel range from 100 nm to 180 nm. Or, the metal nanofilm layer includes silver nanoparticles in the blue sub-pixel, and particle sizes of the silver nanoparticles in the blue sub-pixel range from 5 nm to 10 nm.

Illustratively, the light-emitting element further includes a plurality of pixel units arranged in an array form, each pixel unit includes at least two sub-pixels capable of emitting light in different colors, and the metal nanofilm layer has different thicknesses in different sub-pixels.

Illustratively, the light-emitting element further includes a plurality of pixel units arranged in an array form, each pixel unit includes at least two sub-pixels capable of emitting light in different colors, the metal nanofilm layer corresponding to at least one sub-pixel is located between the anode layer and the light-emitting layer, and the metal nanofilm layer corresponding to at least another sub-pixel is located between the cathode layer and the light-emitting layer.

Illustratively, the at least two sub-pixels include at least two of a red sub-pixel, a green sub-pixel and a blue sub-pixel, the metal nanofilm layer in the blue sub-pixel is arranged between the electron transport layer and the cathode layer, and metal nanofilm layers in the red sub-pixel and the green sub-pixel are arranged between the hole transport layer and the anode layer.

Illustratively, the light-emitting element further includes a plurality of pixel units arranged in an array form, each pixel unit includes at least two sub-pixels capable of emitting light in different colors, and metal nanofilm layers corresponding to the at least two sub-pixels are arranged at a same layer and located between the anode layer and the light-emitting layer or between the cathode layer and the light-emitting layer.

Illustratively, the at least two sub-pixels include at least two of a red sub-pixel, a green sub-pixel and a blue sub-pixel, and the metal nanofilm layers in the red sub-pixel, the green sub-pixel and the blue sub-pixel are arranged between the hole transport layer and the anode layer or between the electron transport layer and the cathode layer.

Illustratively, the light-emitting element further includes a plurality of pixel units arranged in an array form, each pixel unit includes at least two sub-pixels capable of emitting light in different colors, and metal nanofilm layers corresponding to the at least two sub-pixels are located between the anode layer and the light-emitting layer and arranged at different layers.

Illustratively, the light-emitting element further includes a plurality of pixel units arranged in an array form, each pixel unit includes at least two sub-pixels capable of emitting light in different colors, and distances from metal nanofilm layers corresponding to different sub-pixels to the light-emitting layer are different.

Illustratively, the metal nanofilm layers are located between the electron transport layer and the cathode layer, and the electron transport layer has different thicknesses corresponding to different sub-pixels.

Illustratively, the light-emitting layer includes quantum dots.

A method for manufacturing a light-emitting element is further provided, including: providing a substrate: and forming an anode layer, a cathode layer, a light-emitting layer, a hole transport layer, an electron transport layer, a metal nanofilm layer and an hole injection layer on the substrate, the anode layer and the cathode layer are arranged opposite to each other, the light-emitting layer is arranged between the anode layer and the cathode layer, the hole injection layer is arranged between the light-emitting layer and the anode layer, the hole transport layer is arranged between the hole injection layer and the light-emitting layer, the electron transport layer is arranged between the cathode layer and the light-emitting layer, and the metal nanofilm layer is arranged between the anode layer and the cathode layer, and spaced apart from the light-emitting layer at at least one film layer.

Illustratively, when the metal nanofilm layer includes a metal nanoparticle layer, forming the metal nanofilm layer includes: preparing a metal nanoparticle material: forming the metal nanoparticle layer by using the metal nanoparticle material through spinning: or, when the metal nanofilm layer includes an evaporated metal layer, forming the metal nanofilm layer includes: forming a silver thin film through evaporation.

Beneficial effects of the embodiments of the present disclosure are as follows.

In the light-emitting element and the method for manufacturing the light-emitting element of the embodiments of the present disclosure, at least one metal nanofilm layer is introduced between the cathode layer and the anode layer, and the metal nanofilm layer is spaced apart from the light-emitting layer at at least one film layer. As such, a light-emitting element having a new structure is formed. It is able to provide additional electrons toward the light-emitting layer through the hot electron injection effect of the metal nanostructures in the metal nanofilm layer, so as to compensate for the electrons in an element having fewer electrons. In addition, it is able to enhance the intensity of the light from the element through the light coupling effect between the surface plasmon of the metal nanostructures and the light from the light-emitting element. Thus, it is able to simultaneously optimize the electrical and optical properties of the element through the above-mentioned effects of the metal nanofilm layer, so as to improve the efficiency and service life of the element. At the same time, the metal nanofilm layer and the light-emitting layer are not arranged adjacent to each other, and spaced apart from each other at at least one film layer, so it is able to avoid the fluorescence quenching effect of the metal performed on the quantum dots in the light-emitting layer, thereby to prevent the performance of the element from being deteriorated.

DETAILED DESCRIPTION

Figure 1:
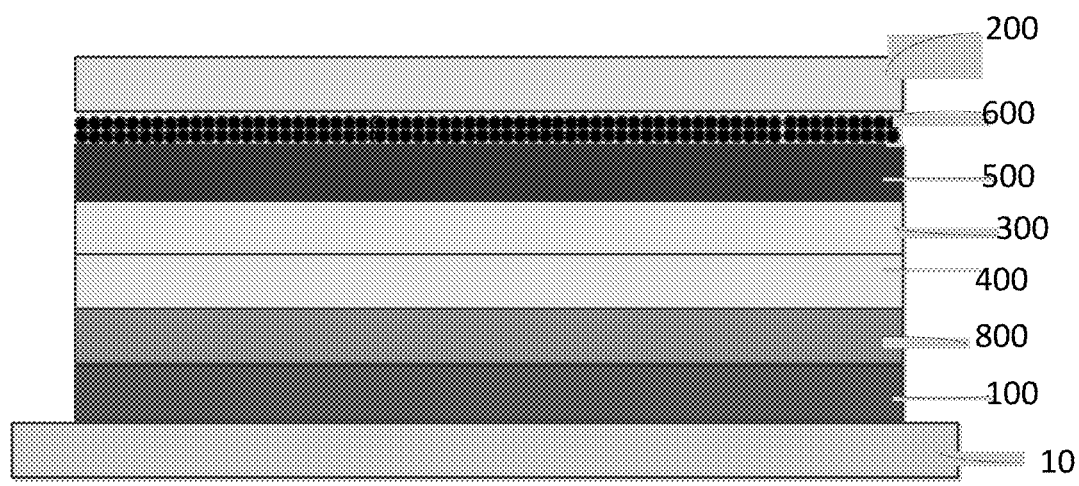
FIG. 1 is a schematic view of a light-emitting element according to some embodiments of the present disclosure.

In order to make the objects, the technical solutions and the advantages of the present disclosure more apparent, the present disclosure will be described hereinafter in a clear and complete manner in conjunction with the drawings and embodiments. Apparently, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Before the detailed description on the embodiments of the present disclosure, it is necessary to describe the related art as follows.

The property of a light-emitting element is optimized mainly through the following two aspects, i.e., the optimization of the property of a light-emitting layer, and the optimization of a structure of the element.

In the related art, unbalanced injection between electrons and holes of the light-emitting element (e.g., a QLED element) usually occurs, and either electrons or holes are likely to become majority carriers in the light-emitting element depending on the structure of the element and materials of functional layers. The unbalanced carrier injection in the element often leads to charging of quantum dots, and then non-radiative recombination occurs, so the efficiency of the light-emitting element is adversely affected, and the service life of the light-emitting element is shortened. Therefore, achieving balanced carrier injection through determining the structure or the materials of the element is crucial for the improvement the efficiency and service life of the light-emitting element.

Due to a "sandwich" type multi-layer stack structure, about 75% of the light from the light-emitting element is dissipated through such non-radiation coupling manners as a waveguide mode caused by total reflection between layers inside the element, a substrate mode among a transparent electrode, a glass and air, and a surface plasma effect generated between metal electrodes, and finally only about 25% of the light exits the element. Therefore, the problem to be solved in the light-emitting element is to improve the light utilization.

In order to solve the above-mentioned problem, as shown in FIGS. 1 and 5 to 8, the embodiments of the present disclosure provide a light-emitting element, including: an anode layer 100 and a cathode layer 200 arranged opposite to each other, a light-emitting layer 300 disposed between the anode layer 100 and the cathode layer 200, a hole transport layer 400 disposed between the light-emitting layer 300 and the anode layer 100, an electron transport layer 500 disposed between the light-emitting layer 300 and the cathode layer 200, and at least one metal nanofilm layer 600 including metal nanostructures, the metal nanofilm layer 600 being arranged between the anode layer 100 and the cathode layer 200 and spaced apart from the light-emitting layer 300 at at least one film layer.

Surface plasmon enhancement effect has been shown to be effective in improving the luminous efficiency of element. It is able for the surface plasmon effect of metal nanostructures (e.g., precious metal nanoparticles) to couple with light, so as to control the light absorption or light emission. When an electromagnetic wave enters a surface of the metal nanostructures, a strong interaction between the metal nanostructures and the light occurs, so as to localize the light around the metal nanostructures, thereby to form a Local Field Enhancement (LFE) effect. When a frequency of the incident light is consistent with the eigenfrequency of the metal nanostructures, resonance between the light and free electrons on the surface of the metal nanostructures occurs, so as to form the strongest interaction and notably improve a light field density. Therefore, it is able to adjust and control a plasmon resonance peak through adjusting a shape and size of each metal nanostructure, and different resonance modes may be generated along different directions when each metal nanostructure is of an anisotropic shape. Due to a low resistivity, such metals as gold, silver are beneficial to reducing the loss of the surface plasmon, and are mainstream plasmon nanomaterials.

In a metal-semiconductor heterostructure, the generation and transport of plasmon hot electrons may be summarized into the following three processes. (1) When the frequency of the incident light matches the eigenfrequency of the metal nanostructure, plasmon resonance occurs, and the absorption and scattering cross sections of the metal nanostructures each reaches a maximum value. (2) The photons in an excited state may be attenuated in the form of radiative and non-radiative transitions. The energy is radiated again in the form of photons in the radiative transitions, while in the non-radiative transitions, the absorbed light energy is transferred to electrons, i.e., the so-called hot electrons. The hot electrons include d-band electrons from the inter-band excitation, and s-band electrons, i.e., plasmon hot electrons, from the intra-band excitation near the Fermi level. These s-band electrons have the characteristics of high excitation efficiency, high energy and being sensitive to a structure having a metal morphology. (3) The generated hot electrons arrive a metal-semiconductor heterostructure interface, and due to the existence of an interface Schottky barrier, low-energy electrons cannot cross the barrier because of insufficient energy, and only electrons having energy higher than the Schottky barrier can cross the barrier, enter the semiconductor, and finally be absorbed and utilized by a semiconductor structure.

Thus, in the light-emitting element of the embodiments of the present disclosure, at least one metal nanofilm layer 600 is introduced between the cathode layer 200 and the anode layer 100, and the metal nanofilm layer 600 is spaced apart from the light-emitting layer 300 at at least one film layer. As such, a light-emitting element having a new structure is formed. It is able to provide additional electrons toward the light-emitting layer 300 through the hot electron injection effect of the metal nanostructures in the metal nanofilm layer 600, so as to compensate for the electrons in an element having fewer electrons. Alternatively, it is able to reduce the holes toward the light-emitting layer 300 per unit time through recombining the generated electrons and the holes, so as to achieve an injection balance of the electrons and the holes in the light-emitting element. In addition, it is able to enhance the intensity of the light from the element through the light coupling effect between the surface plasmon of the metal nanostructures and the light from the light-emitting element. Thus, it is able to simultaneously optimize the electrical and optical properties of the element through the above-mentioned effects of the metal nanofilm layer, so as to improve the efficiency and service life of the element.

It should be appreciated that, if the metal nanofilm layer 600 is arranged adjacent to the light-emitting layer 300, it is unable to avoid the fluorescence quenching effect of the precious metal performed on the quantum dots in the light-emitting layer, and thereby reduce the performance of element. Therefore, in the embodiments of the present disclosure, the metal nanofilm layer 600 is not arranged adjacent to the light-emitting layer 300, and is spaced apart from the light-emitting layer 300 at at least one film layer (for example, at least one film layer of the electron transport layer 500, the hole transport layer 400 and the hole injection layer), so as to avoid the fluorescence quenching effect of the metal performed on the quantum dots in the light-emitting layer, thereby to prevent the performance of the element from being deteriorated.

The light-emitting element may be a quantum dot light-emitting diode (QLED) element, that is, the light-emitting layer includes quantum dots. Alternatively, the light-emitting element may be an organic electroluminescent (OLED) element, and the light-emitting layer is made of an organic electroluminescence material.

It should be appreciated that, the metal nanofilm layer 600 may be a metal nanoparticle layer, and the metal nanostructures are the metal nanoparticles. Alternatively, the metal nanofilm layer 600 may be an evaporated metal layer having metal nano-island structures, i.e. metal nano-island structures.

The metal nanoparticle layer may include, but not limited to, the metal nanoparticles made of at least one of, or any two of, such precious metals as gold, silver, copper, aluminum, platinum, palladium.

The evaporated metal layer may be a silver thin film. That is because the silver thin film has same or similar technical effects as the metal nanoparticles. When a thickness of the evaporated silver thin film is relatively small, e.g., less than or equal to 10 nm, the evaporated silver thin film is formed to have metal nano-island structures. When the metal nano-island structures are applied to the light-emitting element of the embodiments of the present disclosure, it is also able to simultaneously optimize the electrical property and optical property of the light-emitting element, thereby improving the efficiency and service life of the element.

In addition, as shown in FIG. 1, in some embodiments of the present disclosure, the light-emitting element includes: the anode layer 100, the cathode layer 200, the electron transport layer 500, the hole transport layer 400, the hole injection layer 800 and the metal nanofilm layer 600. It is also able to modify the light-emitting element by adding other functional layers into the above structure of the light-emitting element according to actual needs. For example, such layers as an electron injection layer, an electron blocking layer or a hole blocking layer (not shown) may be further added into the light-emitting element according to actual needs. In addition, such a layer as the hole injection layer 800 may not be provided according to actual needs.

In addition, it should be further appreciated that, in practical applications, the light-emitting element may be a normal-type light-emitting element where a bottom electrode is an anode and a top electrode is a cathode, or a reverse-type light-emitting element where a bottom electrode is a cathode and a top electrode is an anode. Accordingly, the light-emitting element may be a top-emission type light-emitting element or a bottom-emission type light-emitting element.

A detailed description on the light-emitting element in the embodiments of the present disclosure will be given below:

FIG. 1 a schematic view of a light-emitting element where layers are laminated one on another. As shown in FIG. 1, in some embodiments, the metal nanofilm layer 600 is disposed between the electron transport layer 500 and the cathode layer 200. The cathode layer 200 is a metal cathode, such as an Al film layer or an Mg/Ag composite conductive film layer, etc. In the case that the metal nanofilm layer 600 is not provided, the light-emitting element is in a state where electrons are minority carriers, and unbalanced injection of the electrons and the holes occurs. In the case that the metal nanofilm layer 600 is provided, hot electrons excited by the local surface plasmon resonance of the metal nano-particles or the metal nano-island structures in the metal nanofilm layer 600 may directly enter the adjacent semiconductor, and additional electrons may be provided and enter the adjacent electron transport layer 500 from the cathode layer 200, and further enter the light-emitting layer 300, so as to compensate for the electrons in the light-emitting element having fewer electrons.

It should be appreciated that, the light-emitting element having fewer electrons is referred to as a light-emitting element having more holes. The light-emitting element having fewer electrons refers to a light-emitting element where the quantity of electrons arriving the light-emitting layer 300 per unit time is less than the quantity of holes arriving the light-emitting layer 300 per unit time, and a ratio of the quantity of electrons arriving the light-emitting layer 300 per unit time to the quantity of holes arriving the light-emitting layer 300 per unit time is not within a predetermined range. The predetermined range refers to a range of the ratio of the quantity of electrons to the quantity of holes arriving the light-emitting layer 300 per unit time when the light-emitting element reaches a desired luminous efficiency.

Similarly, a light-emitting element having more electrons is referred to as a light-emitting element having fewer holes in which unbalanced electron-hole injection occurs. The light-emitting element having more electrons refers to a light-emitting element where the quantity of electrons arriving the light-emitting layer 300 per unit time is more than the quantity of holes arriving the light-emitting layer 300 per unit time, and a ratio of the quantity of electrons arriving the light-emitting layer 300 per unit time to the quantity of holes arriving the light-emitting layer 300 per unit time is not within a predetermined range. The predetermined range refers to a range of the ratio of the quantity of electrons to the quantity of holes arriving the light-emitting layer 300 per unit time when the light-emitting element reaches a desired luminous efficiency.

In other embodiments, the metal nanofilm layer 600 is disposed between the hole transport layer 400 and the anode layer 100, the anode layer 100 includes an indium tin oxide (ITO) or indium zinc oxide (IZO) layer or the like. Thus, in the case that hot electrons are generated through exciting the metal nano-particles or metal nano-island structures by the quantum dots, they may partially recombine with the holes from the anode, so as to reduce the quantity of holes entering the quantum dots and achieve the electron-hole injection balance, thereby improving the element efficiency and service life. The embodiment is applied to the light-emitting element having more electrons, so as to compensate for the holes in the light-emitting element having more electrons.

It should be appreciated that, in the above-mentioned two embodiments, the metal nanofilm layer 600 is arranged between the electron transport layer 500 and the cathode layer 200, so as to mainly adjust and control the carrier injection balance of the element having few electrons. When the metal nanofilm layer is arranged between the hole transport layer 400 and the anode layer 100, so as to mainly adjust and control the carrier injection balance of the element having more electrons. In other embodiments, the metal nanofilm layer 600 may also be arranged between the electron transport layer 500 and the cathode layer 200, and between the hole transport layer 400 and the anode layer 100. In practical applications, the specific location of the metal nanofilm layer 600 may be determined according to actual situations of the unbalanced carrier injection in the element.

Furthermore, in some exemplary embodiments of the present disclosure, the shapes of the metal nanoparticles or metal nano-island structures in the metal nanofilm layer may include, but not limited to, at least one of sphere, rod, nanocone, nanoflower, nanostar, or cube, and the specific shapes may be determined in accordance with the requirements on the adjusting and control of the carrier injection balance in an actual element.

In addition, illustratively, in the case that the metal nanofilm layer 600 includes the metal nanoparticles, particle sizes of the metal nanoparticles may range from 2 nm to 160 nm.

Plasmon resonance may be excited on metal nanostructures of sub-wavelength surface plasmon, such as metal nanostructures of various shapes, through incident light of a specific wavelength. In the case that the frequency of incident light is consistent with the eigenfrequency of metal nanoparticles, resonance between the light and free electrons on the surface of metal nanoparticles occurs, so as to form the strongest interaction and greatly improve the light field density. Therefore, it is able to adjust and control the plasmon resonance peak through adjusting the shape and size of each metal nanoparticle. For example, due to the low resistivity, such metals as gold, silver are beneficial to reducing the loss of the surface plasmon. As such, in the embodiments of the present disclosure, the metal nanoparticle is optionally made of gold and silver.

It should be appreciated that, when the metal nanofilm layer 600 includes the silver thin film having the metal nano-island structures, particle sizes of the metal nano-island structures may also range from 2 nm to 160 nm.

Similarly, plasmon resonance may be excited on metal nanostructures of sub-wavelength surface plasmon, such as metal nanostructures of various shapes, through incident light of a specific wavelength. In the case that the frequency of the incident light is consistent with the eigenfrequency of the metal nano-island structures, resonance between the light and the free electrons on the surface of the metal nano-island structures occurs, so as to form the strongest interaction and greatly improve the light field density. Therefore, it is able to adjust and control the plasmon resonance peak through adjusting the shape and size of each metal nano-island structure.

In addition, such metal nanostructures as metal nanoparticles or metal nano-island structures with the same particle size may response at different degrees to different wavelengths of light, and gold of different sizes may have different strongest absorption wavelengths of light. As the particle sizes of the metal nano-particles or metal nano-islands increase, red-shift occurs for the strongest absorption peak, so as to interact with the red light emitted by red light quantum dots in a better manner, thereby to generate the surface plasmon resonance.

Therefore, illustratively, the light-emitting element includes a plurality of pixel units arranged in an array form, each pixel unit includes at least two sub-pixels capable of emitting light in different colors, the metal nano-particles or metal nano-island structures of the metal nanofilm layer 600 have different particle sizes in different sub-pixels, and the longer a wavelength of light emitted by a sub-pixel, the larger a particle sizes of the metal nano-particles or metal nano-island structures corresponding to the sub-pixel are.

In addition, it is difficult for the absorbance spectrum of the gold nanoparticle to reach a strongest absorption peak of the blue light, and it is able for the absorbance spectrum of the aluminium nanoparticle to reach the strongest absorption peak of the blue light, illustratively, the metal nanofilm layer 600 is an aluminium nanoparticle layer in a blue sub-pixel, and the metal nanofilm layer 600 is a gold nano-particle layer or an aluminum nano-particle layer in a red sub-pixel and a green sub-pixel.

Figure 6:
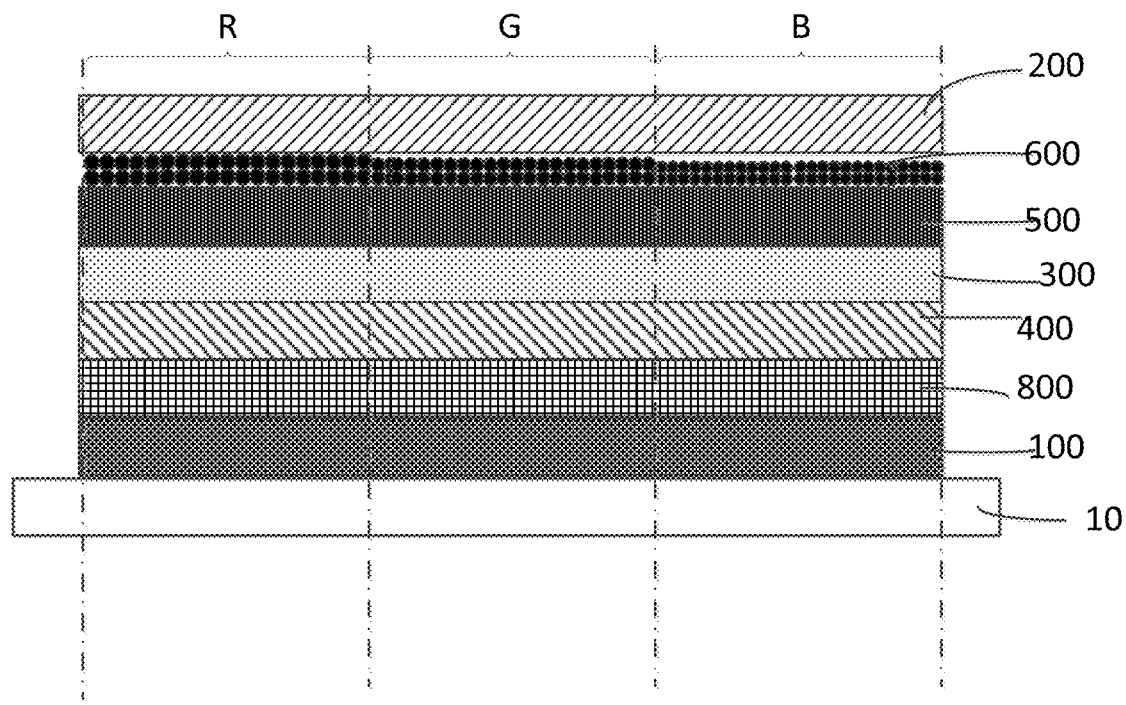
FIG. 6 is another schematic view of the light-emitting element according to some embodiments of the present disclosure.

Taking a case where at least two sub-pixels include at least two of the red (R) sub-pixel, the green (G) sub-pixel and the blue (B) sub-pixel as an example, the metal nano-structures in the metal nanofilm layer 600 have different particle sizes corresponding to different color sub-pixels. As shown in FIG. 6, particle sizes of the metal nanostructures in the metal nanofilm layer 600 corresponding to the blue sub-pixel are relatively small, and particle sizes of the metal nanostructures in the metal nanofilm layer 600 corresponding to the red sub-pixel are relatively large. Generally, in the light-emitting element, emission peaks of R, G and B sub-pixels are 620 nm to 635 nm, 520 nm to 535 nm, and 455 nm to 475 nm respectively. Hence, the strongest absorption peak of the metal nanofilm layer 600 corresponding to each sub-pixel may also be selected in a corresponding range.

For example, the metal nanofilm layer includes gold nanoparticles in the red sub-pixel, and particle sizes of the gold nanoparticles in the red sub-pixel range from 80 nm to 150 nm. The metal nanofilm layer includes gold nanoparticles in the green sub-pixel, and particle sizes of the gold nanoparticles in the green sub-pixel range from 20 nm to 50 nm. The metal nanofilm layer includes aluminium nanoparticles in the blue sub-pixel, and particle sizes of the aluminium nanoparticles in the blue sub-pixel range from 100 nm to 180 nm, or, the metal nanofilm layer includes silver nano-particles in the blue sub-pixel, and particle sizes of the silver nano-particles in the blue sub-pixel range from 5 nm to 10 nm.

Figure 2:
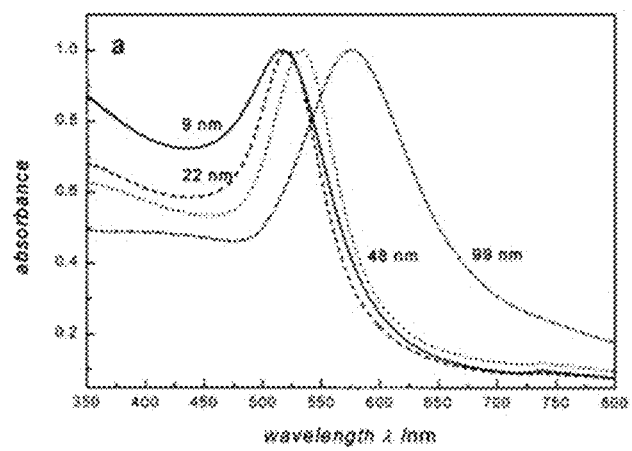
FIG. 2 is an absorbance spectrum of a gold nanoparticle having different particle sizes.
Figure 3:
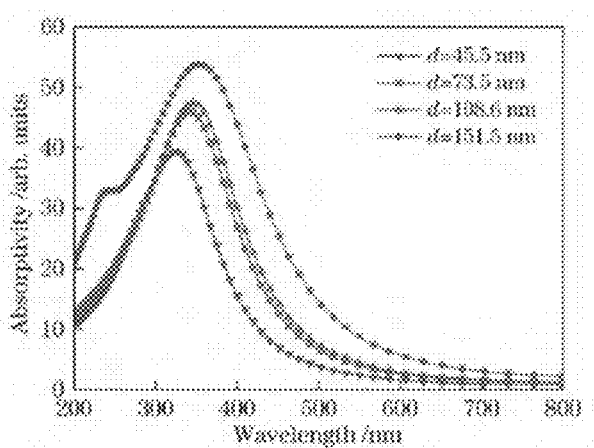
FIG. 3 is an absorbance spectrum of an aluminum nanoparticle having different particle sizes.
Figure 4:
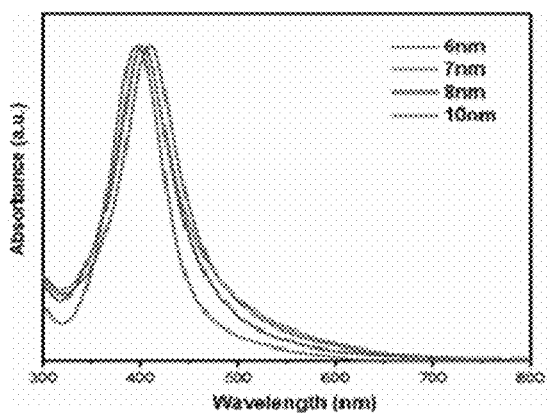
FIG. 4 is an absorbance spectrum of a silver nanoparticle having different particle sizes.
Figure 5:
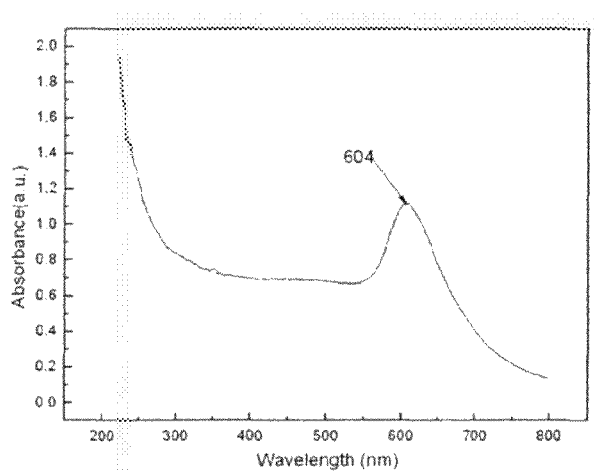
FIG. 5 is an absorbance spectrum of a copper nanoparticle having a particle size of 5 nm.

FIG. 2 is an absorbance spectrum of a gold (Au) nanoparticle having different particle sizes. FIG. 3 is an absorbance spectrum of an aluminum (Al) nanoparticle having different particle sizes. FIG. 4 is an absorbance spectrum of a silver (Ag) nanoparticle having different particle sizes. FIG. 5 is an absorbance spectrum of a copper (Cu) nanoparticle having a particle size of 5 nm.

Taking a case where the metal nanofilm layer 600 is made of aluminum, silver or copper as an example, in accordance with the emission peak of each sub-pixel in a QLED display element, and the strongest absorbance peak of the metal nanofilm layer 600 corresponding to each sub-pixel, particle sizes of nanoparticles in the metal nanofilm layer 600 corresponding to each sub-pixel may be selected within a corresponding range according to the absorbance spectrum shown in FIGS. 2 to 5.

In addition, the greater a thickness of the metal nanofilm layer 600, the greater the injection effect of hot electrons. The specific value of the thickness depends on the actual requirements of the element. Illustratively, in the case that the metal nanofilm layer 600 includes the metal nanoparticles, the thickness of the metal nanofilm layer 600 ranges from 1 nm to 50 nm.

Due to the differences between different color sub-pixels, the metal nanofilm layer 600 may have different thicknesses within different sub-pixels so as to achieve carrier injection balance. In other words, the carrier injection balance difference within each sub-pixel may be adjusted through adjusting differences between the thicknesses of the metal nanofilm layer. The specific differences between the thicknesses of the metal nanofilm layer 600 corresponding to the sub-pixels may be selected in accordance with requirements on the carrier injection balance of the element. It should be appreciated that, the metal nanofilm layer 600 corresponding to each sub-pixel may also have the same thickness.

In addition, due to the differences between different color sub-pixels, the metal nanofilm layer 600 may have different thicknesses within different sub-pixels so as to achieve carrier injection balance.

Figure 8:
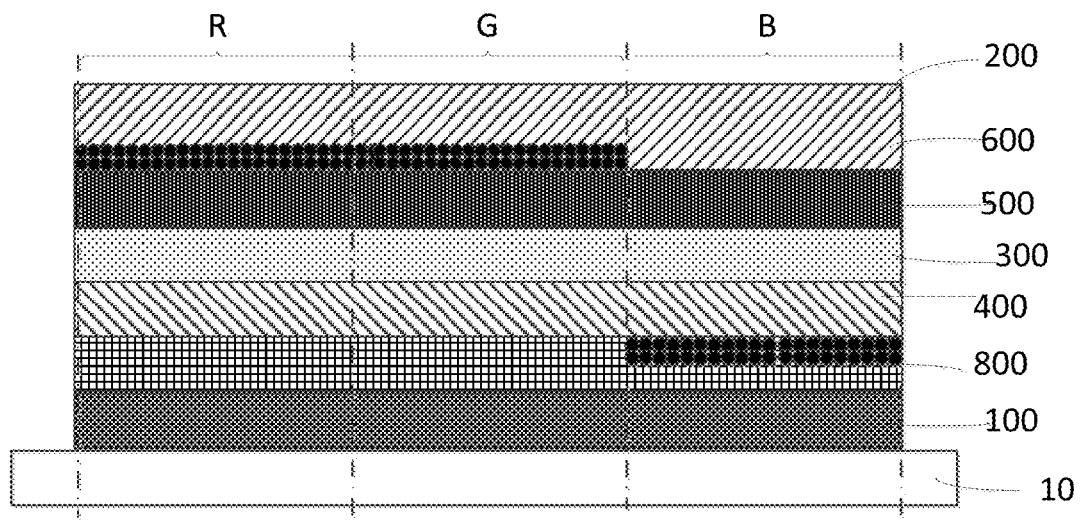
FIG. 8 is still yet another schematic view of the light-emitting element according to some embodiments of the present disclosure.

In a specific embodiment, as shown in FIG. 8, the metal nanofilm layer 600 corresponding to at least one sub-pixel is located between the anode layer 100 and the light-emitting layer 300, and the metal nanofilm layer 600 corresponding to at least another sub-pixel is located between the cathode layer 200 and the light-emitting layer 300.

For example, taking R, G and B sub-pixels as examples, illustratively, in the case that the metal nanofilm layer 600 is not provided, a red light-emitting element and a green light-emitting element may each be an element having more electrons, and a blue light-emitting element may be an element having fewer electrons. The metal nanofilm layer 600 in the blue sub-pixel may be disposed between the electron transport layer 500 and the cathode layer 200, and the metal nanofilm layer 600 in the red sub-pixel and the green sub-pixel may be disposed between the hole transport layer 400 and the anode layer 100.

In this way, in the case that the hot electrons are generated through exciting the metal nanoparticles or metal nano-island structures corresponding to the red sub-pixel and the green sub-pixel by the quantum dots, the hot electrons may partially recombine with the holes from the anode, so as to reduce the quantity of holes entering the quantum dots and achieve the electron-hole injection balance. The hot electrons excited by the local surface plasmon resonance of the metal nano-particles or the metal nano-island structures corresponding to the blue sub-pixel may directly enter the adjacent electron transport layer, and additional electrons may be provided and enter the adjacent electron transport layer 500 from the cathode layer 200, and further enter the light-emitting layer 300, so as to compensate for the electrons in the light-emitting element having fewer electrons, and finally achieve the carrier injection balance of each sub-pixel.

In one specific embodiment, the metal nanofilm layer 600 corresponding to each sub-pixel is located between the anode layer 100 and the light-emitting layer 300 and arranged at a same layer.

Figure 9:
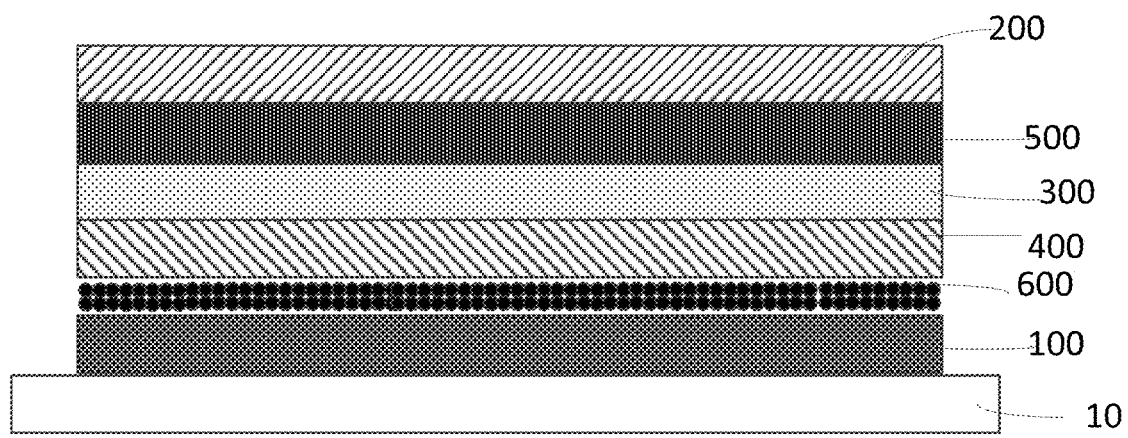
FIG. 9 is still yet another schematic view of the light-emitting element according to some embodiments of the present disclosure.

For example, taking R, G and B sub-pixels as examples, in the case that the metal nanofilm layer 600 is not provided, the red light-emitting element, the green light-emitting element and the blue light-emitting element may each be an element having more electrons. Illustratively, as shown in FIG. 9, in order to achieve the carrier injection balance in the sub-pixels of the light-emitting element, metal nanofilm layers 600 in the red sub-pixel, the green sub-pixel and the blue sub-pixel may be disposed between the hole transport layer 400 and the anode layer 100.

In one specific embodiment, the metal nanofilm layers 600 corresponding to the sub-pixels are located between the anode layer 100 and the light-emitting layer 300 and arranged at different layers.

For example, the metal nanofilm layer 600 corresponding to at least one sub-pixel is disposed between the hole transport layer 400 and the anode layer 100, and the metal nanofilm layer 600 corresponding to at least another sub-pixel is disposed between the hole injection layer 800 and the hole transport layer 400.

For example, taking the R and G sub-pixels as examples, the metal nanofilm layer 600 corresponding to one sub-pixel of the red sub-pixel and the green sub-pixel is disposed between the hole transport layer 400 and the anode layer 100, and the metal nanofilm layer 600 corresponding to the other sub-pixel of the red sub-pixel and the green sub-pixel is disposed between the hole injection layer 800 and the hole transport layer 400.

In one specific embodiment, the metal nanofilm layer 600 corresponding to each sub-pixel is located between the cathode layer 200 and the light-emitting layer 300 and arranged at the same layer.

For example, the metal nanofilm layer 600 corresponding to each sub-pixel is disposed between the electron transport layer 500 and the cathode layer 200 (as shown in FIG. 1).

For example, taking R, G and B sub-pixels as examples, the red light-emitting element, the green light-emitting element and the blue light-emitting element may each be an element having more holes, and the metal nanofilm layers 600 corresponding to the red sub-pixel, the green sub-pixel and the blue sub-pixel may each be arranged between the electron transport layer 500 and the cathode layer 200 (as shown in FIG. 1).

It should be appreciated that the above are some examples in which the arrangement positions of the metal nanofilm layer 600 corresponding to each sub-pixel are different, and it is unable to list all embodiments one by one due to the limited space.

In addition, for the hot electron injection effect of the metal nano-particles or metal nano-island structures, the greater the distance between the metal nanofilm layer 600 and the light-emitting layer 300, the more a loss of the hot electrons generated by the metal nano-particles or metal nano-island structures during the transport in film layers (e.g., the electron transport layer 500 or the hole transport layer 400) between the metal nanofilm layer 600 and the light-emitting layer 300, and thus the less electrons entering the light-emitting layer 300, leading to a poor capability of compensating for the electrons.

The distance between the metal nanofilm layer 600 and the light-emitting layer 300 may be adjusted in accordance with the carrier injection balance difference in the light-emitting element. For the light-emitting element having fewer electrons, if the ratio of electrons to holes arriving the light-emitting layer per unit time differs greatly from the predetermined range, it requires the distance between the metal nanofilm layer 600 and the light-emitting layer 300 to be designed to be small, so as to provide more hot electrons. For the light-emitting element having fewer electrons, when the ratio of electrons to holes arriving the light-emitting layer per unit time is not much different from the predetermined range, the distance between the metal nanofilm layer 600 and the light-emitting layer 300 may be designed to be large, so as to meet the requirements on the carrier injection balance. A specific value of the distance between the metal nanofilm layer 600 and the light-emitting layer 300 depends on the carrier injection balance difference of the element.

In addition, taking a case where the metal nanofilm layer 600 is arranged between the electron transport layer 500 and the cathode layer 200 as an example, the electron transport layer 500 may be zinc oxide, magnesium zinc oxide, aluminum zinc oxide, zinc lithium zinc oxide, titanium oxide, aluminum oxide, etc. Taking the zinc oxide as an example, due to a relatively high electron mobility, the larger a thickness, the lower the electron injection efficiency and the higher an overall starting voltage of the element. Therefore, in the light-emitting element, it requires to adjust the thickness of zinc oxide, so as to achieve the best carrier injection effect.

With regard to the light coupling effect of the metal nano-particles or the metal nano-island structures applied to the element, the smaller the distance between the light-emitting layer 300 and the metal nanofilm layer 600, the better the light coupling effect between the light-emitting layer 300 and the metal nanofilm layer 600, and the better the auxiliary effect of enhancing the intensity of the light through the metal nanofilm layer 600 in the light-emitting element. At the same time, the smaller the distance between the light-emitting layer 300 and the metal nanofilm layer 600, the more favorable the electron transport. For the element having fewer electrons (e.g., cadmium-containing blue light quantum dots), it is more efficiently to achieve the electron-hole injection balance as compared with thinning the electron-transport layer 500 in the related art.

Figure 7:
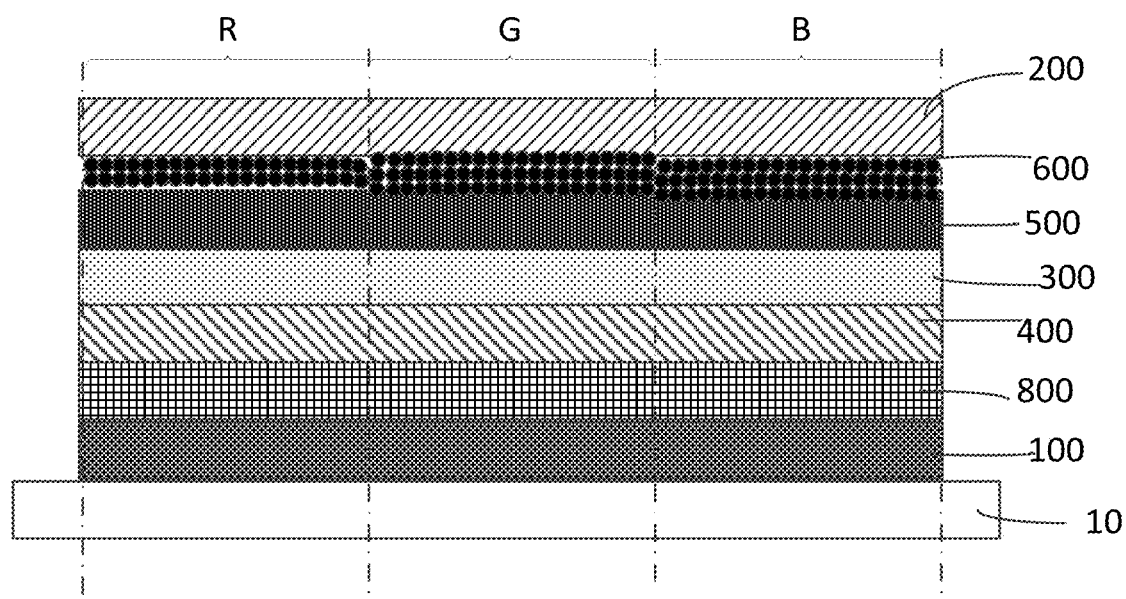
FIG. 7 is yet another schematic view of the light-emitting element according to some embodiments of the present disclosure.

In some embodiments, as shown in FIG. 7, due to the differences in the light coupling effects between the metal nanofilm layers 600 and the light-emitting layer 300 in R, G and B sub-pixels, distances from the metal nanofilm layers 600 corresponding to different sub-pixels to the light-emitting layer 300 are different. The specific differences among distances may be designed in accordance with the requirements on the adjusting and control of the carrier injection balance in the element, and are not limited to a relationship among distances shown in the figure.

In addition, taking the case where the metal nanofilm layer 600 is located between the electron transport layer 500 and the cathode layer 200 as an example, the distance between the metal nanofilm layer 600 and the light-emitting layer 300 may be a thickness of the electron transport layer 500. In this case, the electron transport layer 500 has different thicknesses corresponding to different sub-pixels.

In addition, a QLED display panel is further provided in the embodiments of the present disclosure, including the above-mentioned light-emitting element.

A display apparatus is further provided in the embodiments of the present disclosure, including the above-mentioned light-emitting element.

Furthermore, a method for manufacturing a light-emitting element is further provided in the embodiments of the present disclosure, including the following steps.

Step S01, providing a substrate 10.

Step S02, forming an anode layer 100, a cathode layer 200, a light-emitting layer 300, a hole transport layer 400, an electron transport layer 500, a metal nanofilm layer 600 and an hole injection layer 800 on the substrate 10, where the anode layer 100 and the cathode layer 200 are arranged opposite to each other, the light-emitting layer 300 is arranged between the anode layer 100 and the cathode layer 200, the hole injection layer 800 is arranged between the light-emitting layer 300 and the anode layer 100, and the hole transport layer 400 is arranged between the hole injection layer 800 and the light-emitting layer 300, the electron transport layer 500 is disposed between the cathode layer 200 and the light-emitting layer 300, and the metal nanofilm layer 600 is arranged between the anode layer 100 and the cathode layer 200, and spaced apart from the light-emitting layer 300 at at least one film layer.

In the method for manufacturing the light-emitting element of the embodiments of the present disclosure, at least one metal nanofilm layer is introduced between the cathode layer 200 and the anode layer 100, and the metal nanofilm layer 600 is spaced apart from the light-emitting layer 300 at at least one film layer. As such, a light-emitting element having a new structure is formed. It is able to provide additional electrons toward the light-emitting layer 300 through the hot electron injection effect of the metal nanostructures in the metal nanofilm layer 600, so as to compensate for the electrons in an element having fewer electrons. In addition, it is able to enhance the intensity of the light from the element through the light coupling effect between the surface plasmon of the metal nanostructures and the light from the light-emitting element. Thus, it is able to simultaneously optimize the electrical and optical properties of the element through the above-mentioned effects of the metal nanofilm layer 600, so as to improve the efficiency and service life of the element. At the same time, the metal nanofilm layer 600 and the light-emitting layer 300 are not arranged adjacent to each other, and spaced apart from each other at at least one film layer, so it is able to avoid the fluorescence quenching effect of the metal performed on the quantum dots, thereby to prevent the performance of the element from being deteriorated.

Illustratively, in step S02, in the case that the metal nanofilm layer 600 includes a metal nanoparticle layer, the forming the metal nanofilm layer 600 specifically includes the following steps.

Step S021, preparing a metal nanoparticle material.

Step S022, to forming the metal nanoparticle layer by using the metal nanoparticle material through spinning.

Specifically, step S021 specifically includes: synthesizing the metal nanoparticle material by using a seed growth method, a high temperature reduction method, a template growth method, or an electrochemical synthesis method.

Taking Au (gold) nanoparticles as examples, the preparation method thereof may be as follows.

Adding 0.5 mL chloroauric acid solution having a concentration of 25 mM into 48.5 mL boiling aqueous solution during being stirred. 5 minutes later, adding 1 mL sodium citrate having a concentration of 34.34 mM into the boiling chloroauric acid solution. As the reaction proceeds, the color of the solution changes from colorless to gray, purple, and finally to wine red. In order to obtain a maximum yield of gold nanocrystals, a reaction solution is further refluxed for 30 minutes during being stirred.

In addition, in the above-mentioned step S02, when the metal nanofilm layer 600 includes an evaporated metal layer, the forming the metal nanofilm layer 600 specifically includes: forming a silver film through evaporation.

In order to describe the light-emitting element in the embodiments of the present disclosure in more detail, the light-emitting elements in the figures are taken as examples. In the case that the metal nanofilm layer 600 includes the metal nanoparticles, the light-emitting element is manufactured as follows.

Step S001, providing a base substrate, and cleaning the base substrate.

Step S002, forming the hole injection layer 800 on the base substrate through spinning or inkjet printing.

Step S003, forming the hole transport layer 400 on the hole injection layer 800 through spinning or inkjet printing.

Step S004, forming the light-emitting layer 300 on the hole transport layer 400 through spinning or inkjet printing.

Step S005, forming the electron transport layer 500 on the quantum dot layer through spinning or inkjet printing.

Step S006, preparing the metal nanoparticles on the electron transport layer 500 through spinning.

Step S007, forming the cathode through evaporation and performing encapsulation, so as to finish the manufacture of the whole element.

Taking the light-emitting elements shown in the Figures as examples, in the case that the metal nanofilm layer 600 includes the silver thin film, the method for manufacturing the light-emitting element is as follows.

Step S001, providing a base substrate, and cleaning the base substrate.

Step S002, forming the hole injection layer 800 on the base substrate through spinning or inkjet printing.

Step S003, forming the hole transport layer 400 on the hole injection layer 800 through spinning or inkjet printing.

Step S004, forming the light-emitting layer 300 on the hole transport layer 400 through spinning or inkjet printing.

Step S005, forming the electron transport layer 500 on the quantum dot layer through spinning or inkjet printing.

Step S006, forming the silver thin film having metal nano-island structures on the electron transport layer 500 through evaporation.

In step S007, forming the cathode through evaporation and performing encapsulation, so as to finish the manufacture of the whole element.

Some descriptions will be given as follows.

(1) The drawings merely relate to structures involved in the embodiments of the present disclosure, and the other structures may refer to those known in the art.

(2) For clarification, in the drawings for describing the embodiments of the present disclosure, a thickness of a layer or region is zoomed out or in, i.e., these drawings are not provided in accordance with an actual scale. It should be appreciated that, in the case that such an element as layer, film, region or substrate is arranged "on" or "under" another element, it may be directly arranged "on" or "under" the other element, or an intermediate element may be arranged therebetween.

(3) In the case of no conflict, the embodiments of the present disclosure and the features therein may be combined to acquire now embodiments.

The above embodiments are merely for illustrative purposes, but shall not be construed as limiting the scope of the present disclosure. The scope of the present disclosure shall be subject to the scope defined by the appended claims.

What is claimed is:

1. A light-emitting element comprising:
an anode layer and a cathode layer arranged opposite to each other;
a light-emitting layer disposed between the anode layer and the cathode layer;
a hole transport layer disposed between the light-emitting layer and the anode layer;
an electron transport layer disposed between the light-emitting layer and the cathode layer;
wherein the light-emitting element further comprises:
at least one metal nanofilm layer comprising metal nanostructures, the metal nanofilm layer being arranged between the anode layer and the cathode layer and spaced apart from the light-emitting layer at at least one film layer;
wherein the light-emitting element further comprises a plurality of pixel units arranged in an array form, wherein each pixel unit comprises at least two sub-pixels capable of emitting light in different colors, and the metal nanofilm layer has different thicknesses in different sub-pixels;
wherein distances from a side of metal nanofilm layers, corresponding to different sub-pixels, adjacent to the light-emitting layer to the light-emitting layer are the same.

2. The light-emitting element according to claim 1, wherein the metal nanofilm layer is disposed between the electron transport layer and the cathode layer; and/or, the metal nanofilm layer is disposed between the hole transport layer and the anode layer.

3. The light-emitting element according to claim 1, wherein each metal nanostructure is a metal nanoparticle, and the metal nanoparticle is made of at least one of gold, silver, copper, aluminium, platinum or palladium.

4. The light-emitting element according to claim 3, wherein particle sizes of the metal nanoparticles range from 2 nm to 160 nm.

5. The light-emitting element according to claim 3, wherein a thickness of the metal nanofilm layer ranges from 1 nm to 50 nm.

6. The light-emitting element according to claim 1, wherein the metal nanofilm layer comprises a silver thin film having metal nano-island structures, a thickness of the silver thin film is less than or equal to 10 nm, and the metal nanostructures are the metal nano-island structures.

7. The light-emitting element according to claim 1, further comprising a plurality of pixel units arranged in an array form, wherein each pixel unit comprises at least two sub-pixels capable of emitting light in different colors, the metal nanostructures of the metal nanofilm layer have different particle sizes in different sub-pixels, and the longer a wavelength of light emitted by a sub-pixel is, the larger particle sizes of the metal nanostructures corresponding to the sub-pixel are.

8. The light-emitting element according to claim 7, wherein the at least two sub-pixels comprise at least two of a red sub-pixel, a green sub-pixel and a blue sub-pixel;
the metal nanofilm layer comprises gold nanoparticles in the red sub-pixel, and particle sizes of the gold nanoparticles in the red sub-pixel range from 80 nm to 150 nm;
the metal nanofilm layer comprises gold nanoparticles in the green sub-pixel, and particle sizes of the gold nanoparticles in the green sub-pixel range from 20 nm to 50 nm;
the metal nanofilm layer comprises aluminium nanoparticles in the blue sub-pixel, and particle sizes of the aluminium nanoparticles in the blue sub-pixel range from 100 nm to 180 nm; or, the metal nanofilm layer comprises silver nanoparticles in the blue sub-pixel, and particle sizes of the silver nanoparticles in the blue sub-pixel range from 5 nm to 10 nm.

9. The light-emitting element according to claim 1, further comprising a plurality of pixel units arranged in an array form, wherein each pixel unit comprises at least two sub-pixels capable of emitting light in different colors,
wherein the metal nanofilm layer corresponding to at least one sub-pixel is located between the anode layer and the light-emitting layer, and the metal nanofilm layer corresponding to at least another sub-pixel is located between the cathode layer and the light-emitting layer.

10. The light-emitting element according to claim 9, wherein the at least two sub-pixels comprise at least two of a red sub-pixel, a green sub-pixel and a blue sub-pixel, the metal nanofilm layer in the blue sub-pixel is arranged between the electron transport layer and the cathode layer, and metal nanofilm layers in the red sub-pixel and the green sub-pixel are arranged between the hole transport layer and the anode layer.

11. The light-emitting element according to claim 1, further comprising a plurality of pixel units arranged in an array form, wherein each pixel unit comprises at least two sub-pixels capable of emitting light in different colors, and metal nanofilm layers corresponding to the at least two sub-pixels are arranged at a same layer and located between the anode layer and the light-emitting layer or between the cathode layer and the light-emitting layer.

12. The light-emitting element according to claim 11, wherein the at least two sub-pixels comprise at least two of a red sub-pixel, a green sub-pixel and a blue sub-pixel, and the metal nanofilm layers in the red sub-pixel, the green sub-pixel and the blue sub-pixel are arranged between the hole transport layer and the anode layer or between the electron transport layer and the cathode layer.

13. The light-emitting element according to claim 1, further comprising a plurality of pixel units arranged in an array form, wherein each pixel unit comprises at least two sub-pixels capable of emitting light in different colors, and metal nanofilm layers corresponding to the at least two sub-pixels are located between the anode layer and the light-emitting layer and arranged at different layers.

14. The light-emitting element according to claim 1, wherein the light-emitting layer comprises quantum dots.

15. A method for manufacturing a light-emitting element, comprising:
providing a substrate; and
forming an anode layer, a cathode layer, a light-emitting layer, a hole transport layer, an electron transport layer, a metal nanofilm layer and an hole injection layer on the substrate, wherein the anode layer and the cathode layer are arranged opposite to each other, the light-emitting layer is arranged between the anode layer and the cathode layer, the hole injection layer is arranged between the light-emitting layer and the anode layer, the hole transport layer is arranged between the hole injection layer and the light-emitting layer, the electron transport layer is arranged between the cathode layer and the light-emitting layer, and the metal nanofilm layer is arranged between the anode layer and the cathode layer, and spaced apart from the light-emitting layer at at least one film layer;

wherein the method further comprises:

forming a plurality of pixel units arranged in an array form, wherein each pixel unit comprises at least two sub-pixels capable of emitting light in different colors, and the metal nanofilm layer has different thicknesses in different sub-pixels; wherein distances from a side of metal nanofilm layers, corresponding to different sub-pixels, adjacent to the light-emitting layer to the light-emitting layer are the same.

16. The method for manufacturing the light-emitting element according to claim 15, wherein when the metal nanofilm layer comprises a metal nanoparticle layer, forming the metal nanofilm layer comprises:

preparing a metal nanoparticle material; forming the metal nanoparticle layer by using the metal nanoparticle material through spinning;

or when the metal nanofilm layer comprises an evaporated metal layer, forming the metal nanofilm layer comprises: forming a silver thin film through evaporation.

* * * * *